(12) United States Patent
Wang

(10) Patent No.: US 9,691,703 B2
(45) Date of Patent: Jun. 27, 2017

(54) BOND PAD STRUCTURE WITH DUAL PASSIVATION LAYERS

(71) Applicant: UNITED MICROELECTRONICS CORP., Hsin-Chu (TW)

(72) Inventor: Ye Wang, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/992,006

(22) Filed: Jan. 10, 2016

(65) Prior Publication Data
US 2016/0126186 A1 May 5, 2016

Related U.S. Application Data

(62) Division of application No. 13/659,924, filed on Oct. 25, 2012, now Pat. No. 9,269,678.

(51) Int. Cl.
| | |
|---|---|
| H01L 23/528 | (2006.01) |
| H01L 23/522 | (2006.01) |
| H01L 23/31 | (2006.01) |
| H01L 23/00 | (2006.01) |
| H01L 23/532 | (2006.01) |

(52) U.S. Cl.
CPC ...... *H01L 23/5226* (2013.01); *H01L 23/3192* (2013.01); *H01L 23/528* (2013.01); *H01L 23/53219* (2013.01); *H01L 23/53223* (2013.01); *H01L 23/53295* (2013.01); *H01L 24/03* (2013.01); *H01L 24/05* (2013.01); *H01L 2224/03009* (2013.01); *H01L 2224/0345* (2013.01); *H01L 2224/0362* (2013.01); *H01L 2224/0401* (2013.01); *H01L 2224/04042* (2013.01); *H01L 2224/05166* (2013.01); *H01L 2224/05181* (2013.01); *H01L 2224/05186* (2013.01); *H01L 2224/05567* (2013.01); *H01L 2224/05572* (2013.01); *H01L 2224/131* (2013.01)

(58) Field of Classification Search
USPC .................. 174/257, 250, 258; 438/612, 745
See application file for complete search history.

(56) References Cited

U.S. PATENT DOCUMENTS

| | | |
|---|---|---|
| 5,550,427 A | 8/1996 | Hayashi |
| 5,741,626 A | 4/1998 | Jain |
| (Continued) | | |

OTHER PUBLICATIONS

S. Chen, C. L. Chen and Samuel Tsou, "Sputtered TiN Performance as an Anti-Reflective Coating in Backend Sub-um i-Line Lithography Process", Process Development Dept., Winbond Electronics Corp., Science-Based Industrial Park, Hsinchu, Taiwan, R.O.C., Jun. 11-12, 1991 VMIC Conference, TH-0359-0/91/0000-0393 $01. 00 C 1991 IEEE, pp. 393-395.

*Primary Examiner* — Timothy Thompson
*Assistant Examiner* — Michael F McAllister
(74) *Attorney, Agent, or Firm* — Winston Hsu

(57) ABSTRACT

A bond pad structure with dual passivation layers is disclosed. The bond pad structure includes: a pad material layer on a first passivation layer; a protection layer on the top surface of the pad material layer; a second passivation layer covering on the first passivation layer and the protection layer; and an opening formed through the second passivation layer and the protection layer to expose the pad material layer.

14 Claims, 5 Drawing Sheets

(56) References Cited

U.S. PATENT DOCUMENTS

| | | | | |
|---|---|---|---|---|
| 5,930,664 A * | 7/1999 | Hsu | .................. | H01L 21/31116 257/E21.252 |
| 5,985,765 A * | 11/1999 | Hsiao | ..................... | H01L 24/02 257/E21.507 |
| 6,090,696 A * | 7/2000 | Jang | .................. | H01L 21/76877 257/E21.585 |
| 6,251,774 B1 | 6/2001 | Harada | | |
| 6,998,335 B2 * | 2/2006 | Fan | ........................ | H01L 24/03 257/E21.508 |
| 7,276,450 B2 | 10/2007 | Mezzapelle | | |
| 7,294,565 B2 * | 11/2007 | Burrell | ............... | H01L 23/3192 257/763 |
| 7,964,494 B2 * | 6/2011 | Drexl | ............... | H01L 23/53228 257/E21.508 |
| 8,207,052 B2 * | 6/2012 | Hua | ....................... | H01L 24/03 438/585 |
| 8,236,703 B2 * | 8/2012 | Griffin, Jr. | ........ | H01L 21/02063 216/37 |
| 2002/0016070 A1 * | 2/2002 | Friese | .................... | H01L 22/32 438/689 |
| 2002/0076913 A1 * | 6/2002 | Lee | ......................... | H01L 24/11 438/614 |
| 2003/0085408 A1 | 5/2003 | Yang | | |
| 2004/0033685 A1 | 2/2004 | Jeng | | |
| 2005/0048755 A1 * | 3/2005 | Roche | .............. | H01L 21/32134 438/612 |
| 2005/0048772 A1 | 3/2005 | Pan | | |
| 2006/0089007 A1 | 4/2006 | Huang | | |
| 2006/0121717 A1 * | 6/2006 | Yu | ..................... | H01L 21/76828 438/612 |
| 2006/0166402 A1 | 7/2006 | Lim | | |
| 2009/0181542 A1 * | 7/2009 | Lo | .................... | H01L 21/02063 438/700 |
| 2012/0056328 A1 * | 3/2012 | Lai | .................... | H01L 21/76898 257/774 |

* cited by examiner

US 9,691,703 B2

BOND PAD STRUCTURE WITH DUAL PASSIVATION LAYERS

CROSS REFERENCE TO RELATED APPLICATIONS

This application is a division of U.S. application Ser. No. 13/659,924 filed Oct. 25, 2012, and incorporated herein by reference in its entirety.

BACKGROUND OF THE INVENTION

1. Field of the Invention

The present invention generally relates to a bond pad structure and, more particularly, to a bond pad structure with a protection layer.

2. Description of the Prior Art

In semiconductor manufacturing, a fabricated integrated circuit (IC) device is typically assembled into a package to be utilized on a printed circuit board (such as a motherboard, etc) as part of a larger circuit. When the fabrication of the integrated circuit device (such as a die) is finished, the integrated circuit device is immovably bound and sealed using an electronic package technique so as to prevent damages from an external force or other environmental factors. A package substrate is often used in the electronic package industry to affix the integrated circuit device thereon, and it also provides one or more layers of metal interconnects, wherein one end of the metal interconnect is electrically connected to the integrated circuit device, and the other end thereof is electrically connected to the other electronic modules. The metal bond pad (or referred to as bonding pad) is designed to be in the openings of the passivation layer (i.e. topmost insulating layer) of the integrated circuit device as a mean to connect the metal interconnects of the package substrate to the integrated circuit device.

In the past, aluminum or aluminum alloys, such as AlCu alloy or AlSiCu alloy, have been used as conventional chip wiring materials. More recently, aluminum wiring material has been replaced by copper and copper alloys with damascene process, since copper wiring can provides improved chip performances and superior reliability when compared to aluminum and aluminum alloys. However, in the packaging of IC devices, employing copper wiring may induce a number of process issues, such as the reaction of copper with the material used in the ball-soldering process, and/or the susceptibility of copper to the environmental damages and corrosion. To solve these process issues, a terminal aluminum pad or aluminum cap structure is designed to be formed on the copper interconnection for protecting the copper from environmental deterioration.

Although the use of an aluminum pad/cap structure on the copper interconnection may solve the conventional copper deterioration issues, it still has some process drawbacks to improve. As well-known in the semiconductor field, aluminum materials are quite vulnerable to the corrosion issue, especially for the aluminum structure in the aforementioned pad loop. In this process stage, a thick photoresist layer used for patterning the aluminum pad may leave residues on the surface of aluminum layer due to the PR hardening, thereby significantly increasing the possibility of Al corrosion. This is major cause of the so-called "pad discoloration" issue.

Therefore, while aforementioned existing methods of fabricating bond pad structures for semiconductor devices have been generally adequate for their intended purposes, they have not been entirely satisfactory in every aspect. There is still a need to improve the bond pad structure and the manufacturing method thereof in order to provide larger process windows as well as to lower the process costs.

SUMMARY OF THE INVENTION

To improve the above-mentioned drawbacks in the fabrication of the bond pad in prior art, a novel method of manufacturing a bond pad structure is provided in the present invention. A protection layer is used in present invention to cover the pad material layer before the pad material layer is etched and patterned into a bond pad. The protection layer is suitable for protecting the underlying pad material layer from corrosion or pad discoloration issue, thereby providing a larger process window for the bond pad loop. Moreover, the protection layer may be easily removed from the underlying bond pad structure by a simple strip or wet etching process after forming the bond pad, so this approach may lower the possibility of bond pad damage during the etching process and lower the manufacturing costs.

One object of the present invention is to provide a method of manufacturing a bond pad structure comprising the steps of forming a pad material layer on a passivation layer, forming a protection layer on the pad material layer, using a photoresist as a mask to perform an etching process for patterning the protection layer and the pad material layer into a bond pad structure, and removing the protection layer on the bond pad structure.

Another object of the present invention is to provide a method of manufacturing a bond pad structure comprising the steps of forming a pad material layer on a first passivation layer, forming a protection layer on the pad material layer, performing a first etching process to pattern the protection layer and the pad material layer into a bond pad structure, forming a second passivation layer on the bond pad structure and the first passivation layer, and performing a second etching process to remove a part of the second passivation layer and the protection layer so that the bond pad structure is exposed.

According to another aspect of the present invention, a bond pad structure with dual passivation layers is disclosed. The bond pad structure includes: a pad material layer on a first passivation layer; a protection layer on the top surface of the pad material layer; a second passivation layer covering on the first passivation layer and the protection layer; and an opening formed through the second passivation layer and the protection layer to expose the pad material layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles.

In the drawings.

Figure 1:
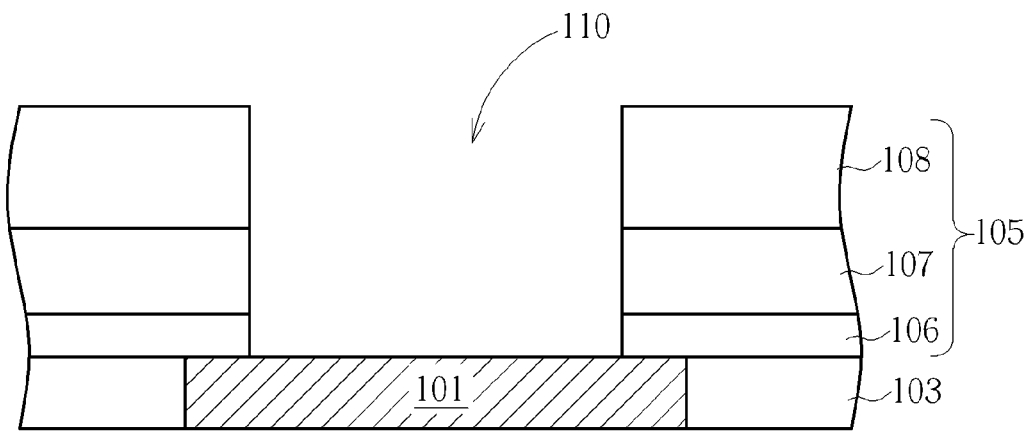
FIGS. 1-6 are cross-sectional views illustrating the process flow of manufacturing a bond pad structure with single passivation in accordance with the first embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In following detailed description of the present invention, reference is made to the accompanying drawings which form a part hereof, and in which is shown, by way of illustration, specific embodiments in which the invention may be practiced. These embodiments are described in sufficient details to enable those skilled in the art to practice the invention. Other embodiments may be utilized and structural, logical, and electrical changes may be made without departing from the scope of the present invention.

The embodiments will now be explained with reference to the accompanying drawings to provide a better understanding of the process of the present invention, wherein FIGS. 1-6 are cross-sectional views illustrating the process flow of manufacturing a bond pad with a single passivation configuration in accordance with the first embodiment of present invention; and FIGS. 7-10 are cross-sectional views illustrating the process flow of manufacturing a bond pad with dual passivations configuration in accordance with the second embodiment of present invention.

Please now refer to FIGS. 1-6, which illustrates the process flow in first embodiment of the present invention. The process of the present embodiment is particularly directed to form a protruding bond pad structure which is suitable for direct wire bonding in packaging processes.

First, the process of present embodiment starts from a prepared copper interconnection, for example: a top metal Cu layer or a Cu contact. As shown in FIG. 1, this copper structure may be a copper layer 101 deposited within a patterned opening formed in an insulating layer 103, such as a layer made of fluorinated TEOS (tetraethoxysilane) or fluorinated silicate glass (FSG). In the first place, the copper layer 101 is designed to serve as a contact for connecting the external electrical circuit. However, as mentioned in the description of the prior art, a copper interconnection may usually require an aluminum cap or pad structure to protect the copper from environmental deterioration, such as oxidation from the ambient atmosphere. To form this aluminum pad structure, a passivation layer 105 is first deposited on the prepared copper layer 101 and the insulating layer 103. In the present embodiment, the passivation layer 105 may be a multilayer structure or an insulating stack made of successive silicon nitride layer (SiN) 106, silicon oxide layer (such as plasma enhanced silicon oxide layer) 107, and a silicon nitride layer (SiN) 108. The passivation layer 105 may provide protection to the underlying copper layer 101, and also provide space to form a via or an opening for receiving the aluminum pad structure. As shown in FIG. 1, an opening or a via 110 is formed through the entire passivation layer 105 to expose a part of the underlying copper layer 101. This may ensure that the ensuing aluminum pad formed in later process may have a good electrical connection with the copper layer 101.

Figure 2:
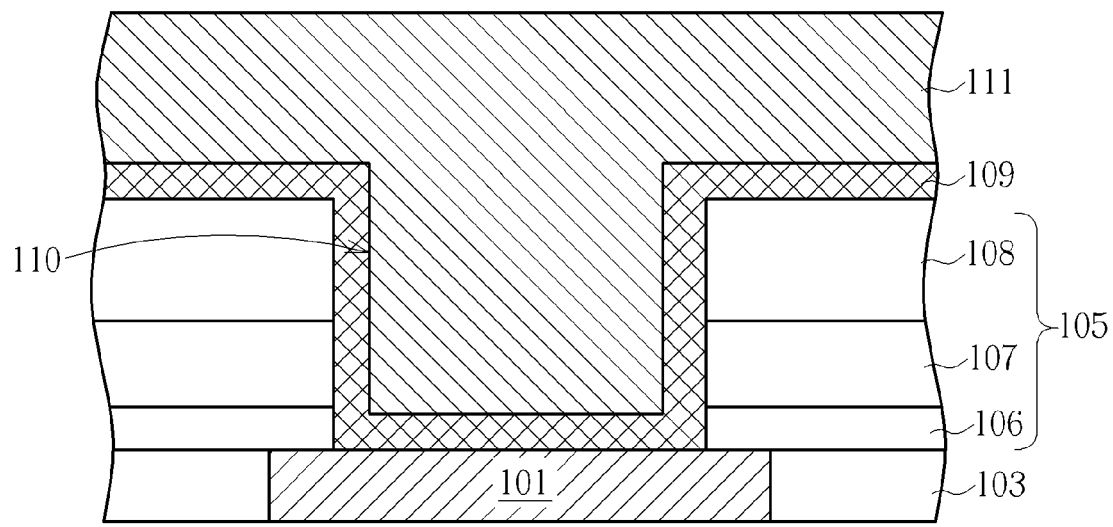

Before forming the ensuing aluminum pad structure, it is preferable in the process to form a barrier layer 109 on the copper layer 101 to serve as a diffusion barrier between the copper layer 101 and the ensuing aluminum pad. As shown in FIG. 2, the barrier layer 109 is conformally formed over the copper layer 101 and the passivation layer 105, including the sidewalls of opening 110. The material of the barrier layer 109 may be Ti, TiN, Ta, TaN, TiW, WN or a combination thereof, which may efficiently prevent the intermigration of Cu atoms and Al atoms in the copper layer 101 and the ensuing aluminum pad (referred hereafter as Al pad) once the copper layer 101 is in contact with the Al pad.

After the barrier layer 109 is formed, please refer again to FIG. 2, a pad material layer 111 (ex. an aluminum layer) is deposited through physical vapor deposition or chemical vapor deposition over the barrier layer 109. The material of the pad material layer 111 may be aluminum or an aluminum alloy made of AlCu or AlSiCu. A portion of the pad material layer 111 fills up the opening 110 to form a plug-like structure which is connected to the exposed copper layer 101. The deposited pad material layer 111 will be patterned into pad shape in following process.

Figure 3:
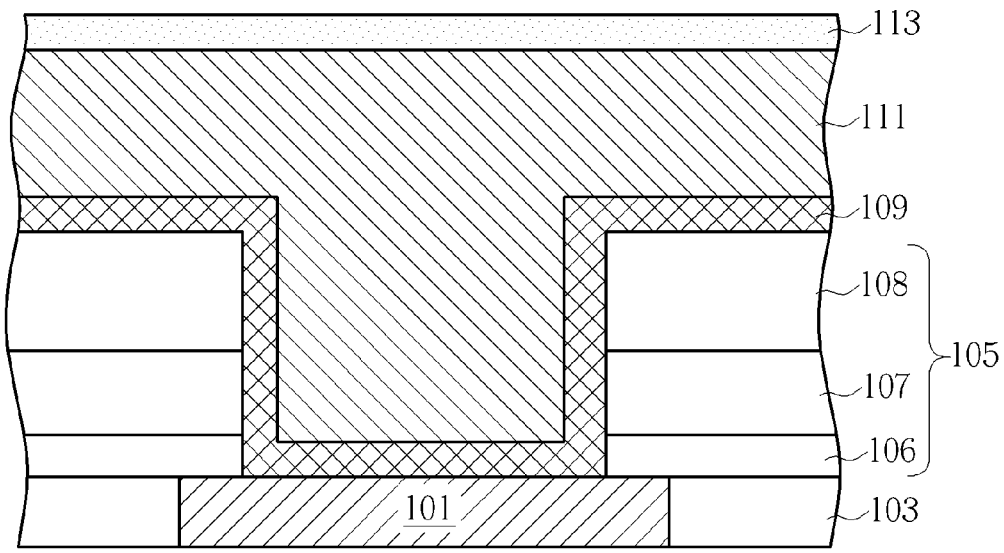

Before patterning the pad material layer 111 into bond pads, please refer to FIG. 3, a protection layer 113 is first deposited on the pad material layer 111. In this embodiment of the present invention, the protection layer 113 is designed to grant the conventional bond pad process loop larger process window. The material of the protection layer 113 may be selected from the group of dielectric materials, such as undoped silicon carbide (SiC), doped silicon carbide (ex. SiC (N, H, O)), silicon oxynitride (SiON), oxide and nitride, or the group of inert metal, such as Ti or TiN, wherein the non-metal dielectric material is preferred in order to grant the protection layer 113 different etching selectivity from the metal pad material layer 111 (ex. Al or AlCu) in the following patterning processes, and also to make the protection layer 113 easy to be removed.

Figure 4:
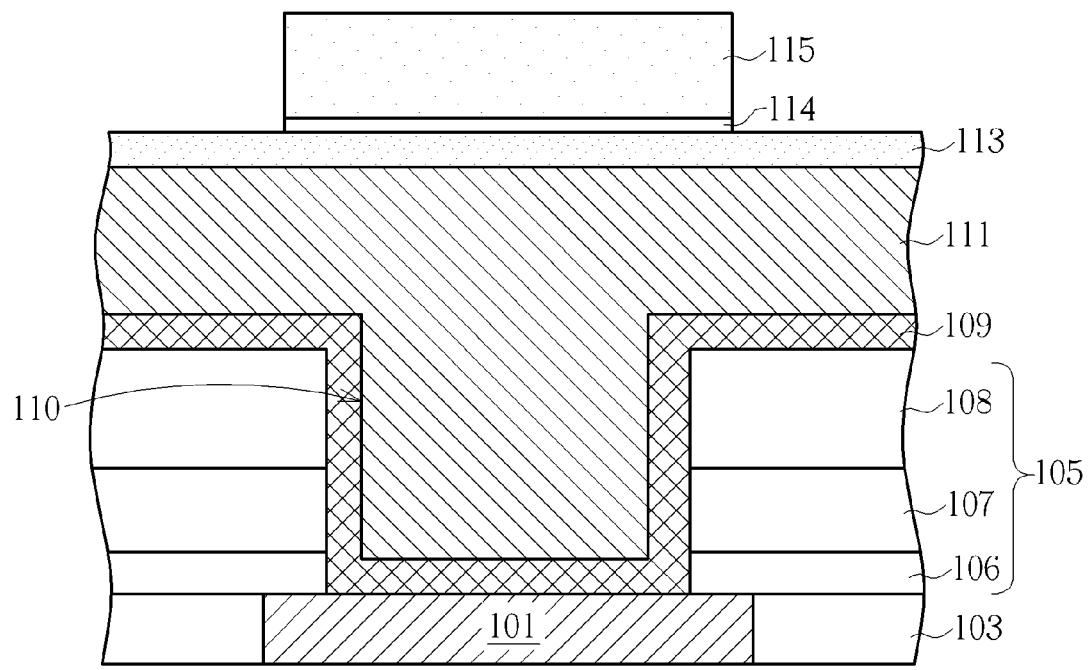

After the protection layer 113 is deposited on the pad material layer 111, please refer to FIG. 4, a patterned photoresist 115 is formed on the protection layer 113 by photolithographic process. The photoresist 115 is used to define the position and shape of the desired aluminum pad on the passivation layer 105. Preferably, the photoresist 115 will be aligned with the underlying copper layer 101, with a coverage area larger than the opening 110. Alternatively, in some embodiment of present invention, a bottom anti-reflective coating (BARC) 114 may be provided between the photoresist 115 and the protection layer 113 to reduce the light reflection at the interface between the photoresist 115 and the dielectric protection layer 113.

Figure 5:
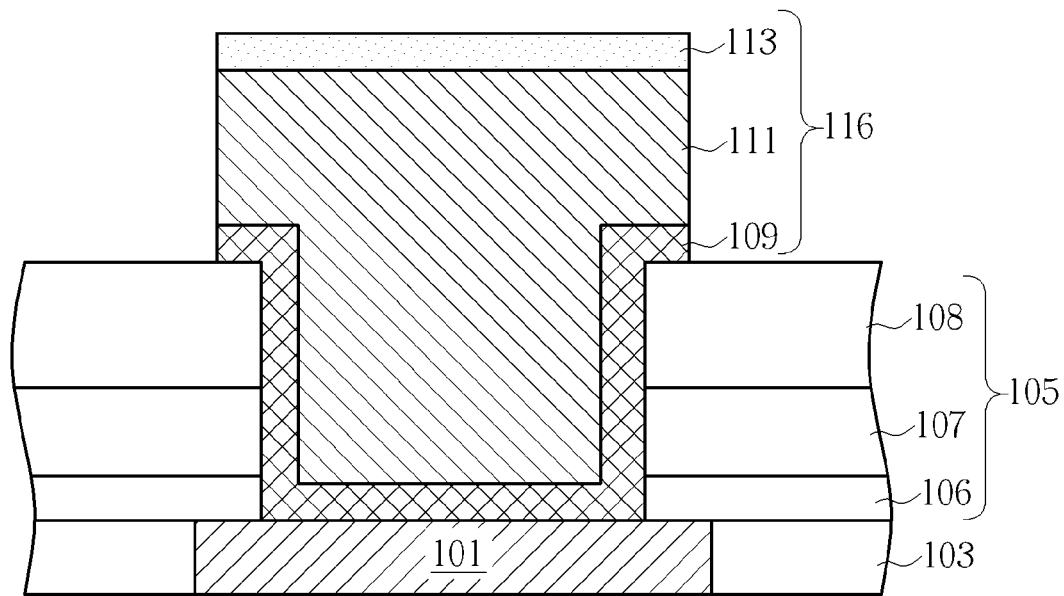

Please refer now to FIG. 5, an etching process is then performed with the photoresist 115 as an etching mask to shape an aluminum pad. The etching process will remove parts of the dielectric protection layer 113, the pad material layer 111, the barrier layer 109, or even parts of the SiN layer 108. Through this etching process, a protruding Al bond pad 116 is shaped on the passivation layer 105, which is electrically connected to the underlying copper layer 101. Thereafter, the residue photoresist 115 and BARC 114 on the bond pad 116 is removed by regular strip process.

Figure 6:
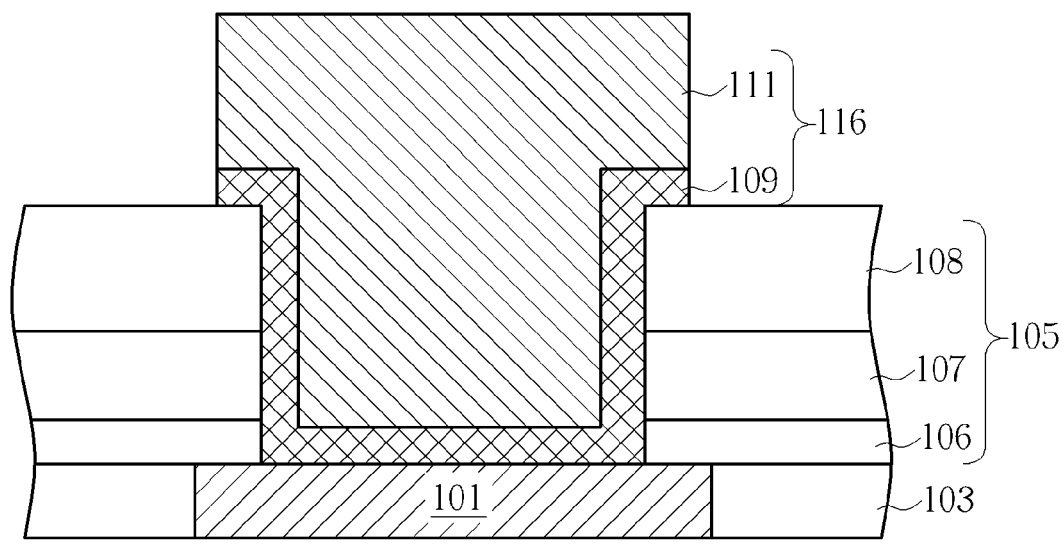

After the bond pad 116 is formed, please refer to FIG. 6, the protection layer 113 should also be removed prior to the wire bonding process in order to expose the pad material layer 111. In this embodiment of the present invention, the removal of protection layer 113 may be easily achieved by a simple Al etch strip, a wet etching, or a post-etch clean treatment, without any extra steps or cost. This advantage may be credited to the material used in the dielectric protection layer 113, which was selected from the material which can be easily removed and have a different etching rate from the underlying pad material layer (ex. Al layer) 111.

In addition to the easy removing process, another advantage of present invention is: with the protection of inert protection layer 113, the underlying Al layer will be free from the corrosion problem resulting from the PR residue or PR hardening on the Al layer after the PR strip process. Moreover, the easy removal of the protection layer 113 may also completely remove the PR or BARC residue from the bond pad 116. This may further lower the occurrence of Al corrosion or pad discoloration issue.

In the present embodiment, optionally, the completed bond pad 116 may be further covered with a topmost passivating polyimide layer (not shown) before the wire bonding or probe test step, depending on the process or product requirement.

Now, please refer to FIGS. 7-10 which illustrate the cross-sectional view of a process flow for manufacturing a bond pad structure with dual passivations in accordance with the second embodiment of present invention.

The process of the present embodiment is particularly directed to form an embedded bond pad structure wherein each Al bond pad is embedded in, rather than protruding from the passivation layer. This kind of embedded bond may be suitable for processes or packaging with solder ball limiting metallurgy (BLM) or solder bumps.

Figure 7:
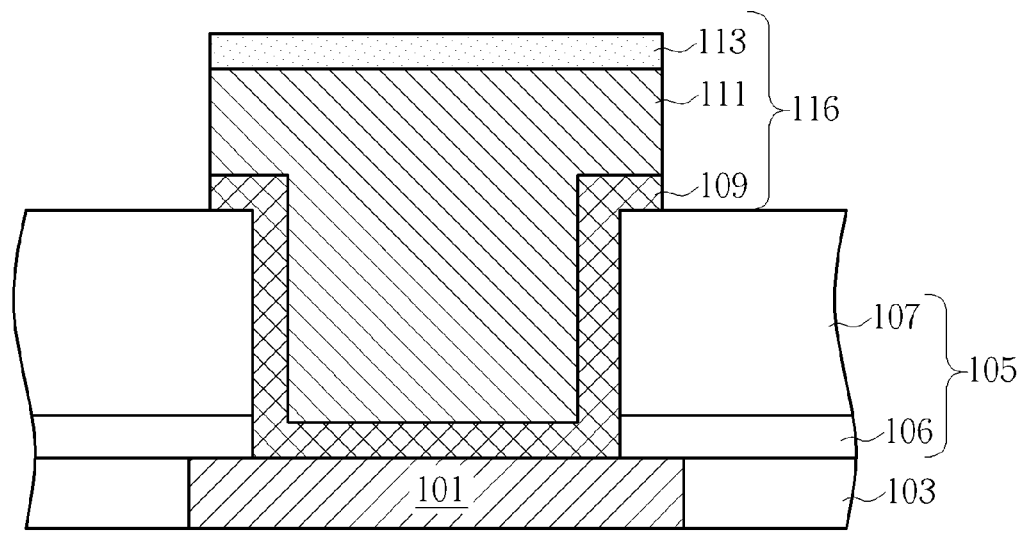
FIGS. 7-10 are cross-sectional views illustrating the process flow of manufacturing a bond pad structure with dual passivations in accordance with the second embodiment of the present invention.

As shown in FIG. 7, the present embodiment starts from a prepared pad structure similar to the bond pad 116 shown in FIG. 5, wherein the protection layer 113 is still present on the bond pad structure, and the photoresist 115 and BARC 114 used in pad etching process have already been removed. The difference between the bond pad structures shown in FIG. 5 and FIG. 7 is that the passivation layer 105 of the bond pad structure in FIG. 7 is made of only a SiN layer 106 and a PEOX layer 107.

Figure 8:
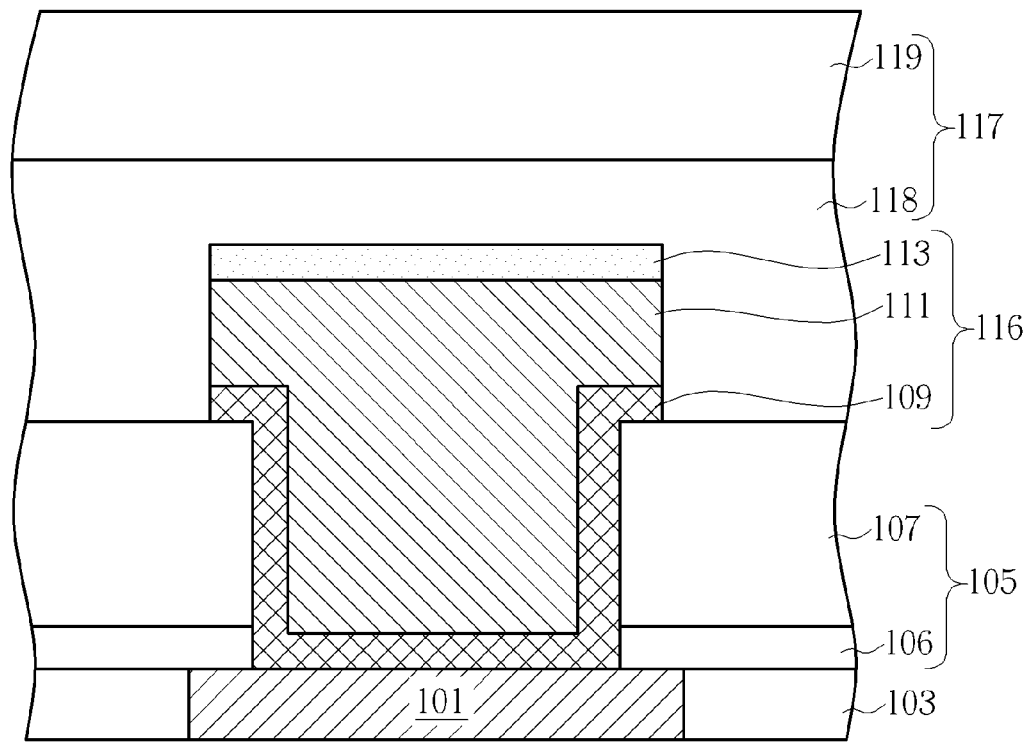

In order to form a pad structure suitable for the ball bonding, please refer to FIG. 8, another passivation layer (i.e. second passivation layer) 117 is necessary to cover the prepared Al bond pad 116. The passivation layer 117 can provide space to form a predetermined opening or a via for ball limiting metallurgy or for the placement of the solder ball. In this embodiment, the passivation layer 117 may be a multilayer structure or an insulating stack made of a FSG layer 118 and a SiN layer 119. The passivation layer 117 may combine with the underlying passivation layer (i.e. the first passivation layer) 105 and encompass the entire bond pad 116.

Figure 9:
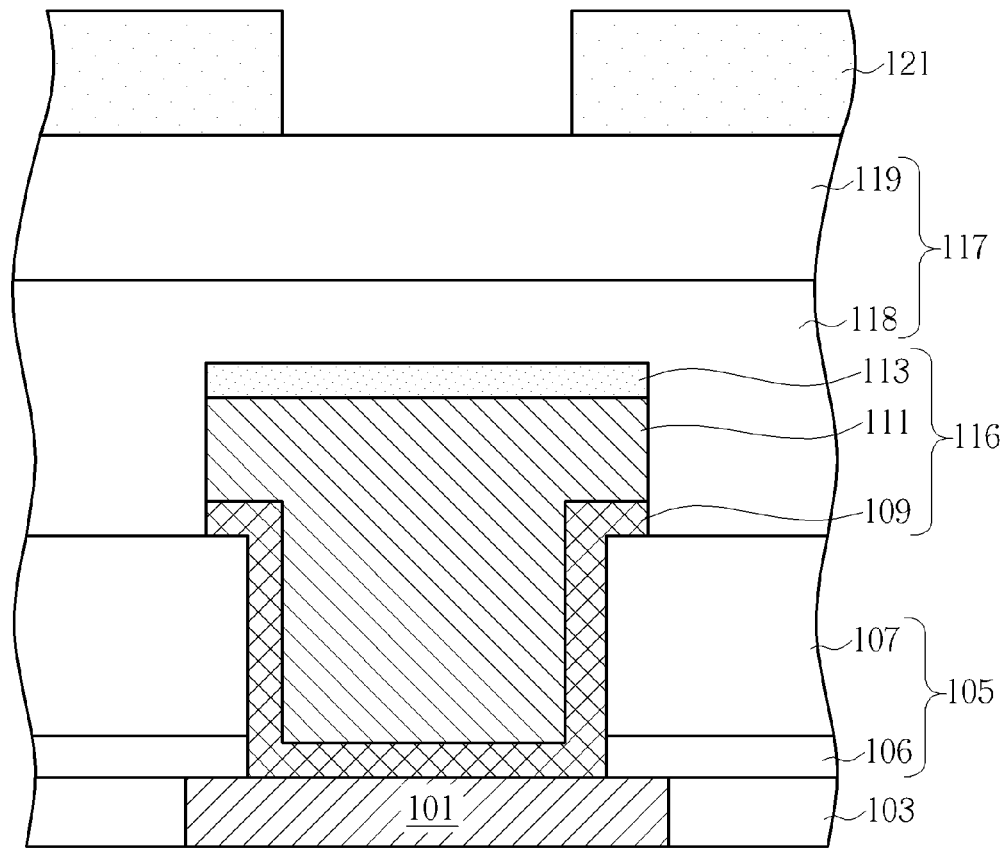

After the passivation layer 117 is deposited on the bond pad 116, please refer to FIG. 9, a patterned photoresist 121 is formed on the passivation layer 117 by photolithographic process. Unlike the first embodiment, the photoresist 121 is designed to define an opening or a via in the passivation layer 117 for exposing the underlying bond pad, rather than to define the bond pad. Preferably, the opening defined by the photoresist 115 is aligned with the opening 110 and is smaller than the area of the underlying bond pad 116.

Figure 10:
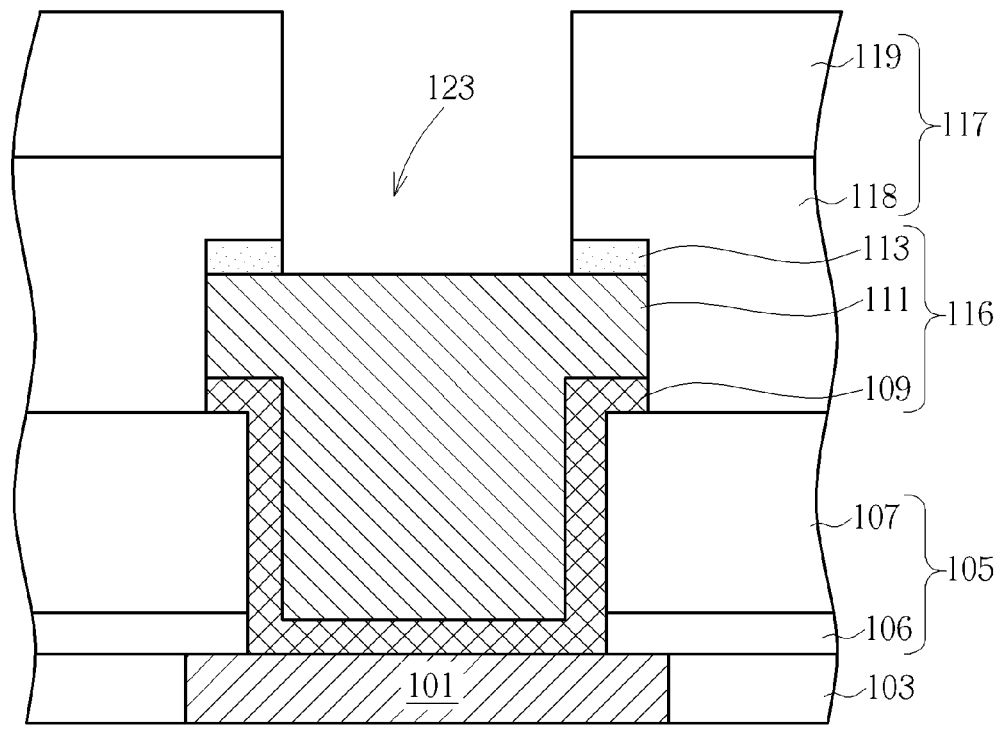

Subsequently, please refer to FIG. 10, an etching process is performed by using the photoresist 121 as a mask. The etching process may be anisotropic dry etching process which removes a part of the FSG layer 118, of the SiN layer 119 and of the protection layer 113, thereby forming an opening or a via 123 which exposes the pad material layer 111 (ex. a conductive Al layer) for the embedded bond pad 116 to electrically connect with external interconnection structures, such as a under-ball-metallurgy (UBM) layer, a solder ball or a solder bump.

The protection layer 113 in this embodiment of present invention may be easily removed along with the overlying passivation layer 117 by single dry etching process, without damaging the underlying bond pad structure. This is due to the materials of the dielectric protection layer 113 and overlying passivation layer 117 are preferably non-metal materials and may have a good etching selectivity to the underlying metal pad material layer 111. Accordingly, the design of protection layer 113 on the bond pad structure not only can reduce the process costs and steps to manufacture an embedded bond pad, but can also improve the process window of the involved etching processes.

According to the second embodiment of present invention, a bond pad structure with dual passivations is provided, comprising a bond pad 116 formed on a first passivation layer 115, a protection layer 113 formed on the top surface of said bond pad, a second passivation layer 117 covering on the first passivation layer 115 and the protection layer 113, and an opening 123 formed through the second passivation layer 117 and the protection layer 113 to expose the bond pad 116.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bond pad structure with dual passivation layers, comprising:
    a pad material layer on a first passivation layer;
    a protection layer on the top surface of the pad material layer, wherein the protection layer comprises a dielectric material;
    a second passivation layer covering on the first passivation layer and the protection layer, wherein the second passivation layer comprises a first layer and a second layer and the edges of the first layer and the second layer are aligned with an edge of the protection layer; and
    an opening formed through the second passivation layer and the protection layer to expose the pad material layer.

2. The bond pad structure with dual passivation layers according to claim 1, wherein the pad material layer comprises aluminum or aluminum alloy.

3. The bond pad structure with dual passivation layers according to claim 2, wherein the aluminum alloy comprises AlCu or AlSiCu.

4. The bond pad structure with dual passivation layers according to claim 1, further comprising a barrier layer between the first passivation layer and the pad material layer.

5. The bond pad structure with dual passivation layers according to claim 4, wherein the barrier layer comprises Ti, TiN, Ta, TaN, TiW, WN, or combination thereof.

6. The bond pad structure with dual passivation layers according to claim 4, wherein an edge of the protection layer is aligned with an edge of the barrier layer.

7. The bond pad structure with dual passivation layers according to claim 1, wherein an edge of the protection layer is aligned with an edge of the pad material layer.

8. The bond pad structure with dual passivation layers according to claim 1, wherein an edge of the protection layer is aligned with an edge of the opening.

9. The bond pad structure with dual passivation layers according to claim 1, wherein the protection layer is selected from the group of dielectric undoped SiC, doped SiC, SiON, oxide or nitride, or inert Ti or TiN.

10. The bond pad structure with dual passivation layers according to claim 1, wherein the first passivation layer comprises a first SiN layer, a PEOX layer, and a second SiN layer.

11. The bond pad structure with dual passivation layers according to claim 1, wherein the first passivation layer comprises a SiN layer and a PEOX layer.

12. The bond pad structure with dual passivation layers according to claim 1, wherein the second passivation layer comprises a FSG layer and a SiN layer.

13. The bond pad structure with dual passivation layers according to claim 12, wherein an edge of the FSG layer is aligned with an edge of the protection layer.

14. The bond pad structure with dual passivation layers according to claim 12, wherein an edge of the SiN layer is aligned with an edge of the protection layer.

* * * * *